(12) United States Patent
Yang et al.

(10) Patent No.: US 8,729,952 B2
(45) Date of Patent: May 20, 2014

(54) SWITCHING DEVICE WITH NON-NEGATIVE BIASING

(75) Inventors: Xiaomin Yang, Longwood, FL (US); James P. Furino, Jr., Melbourne, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/587,590

(22) Filed: Aug. 16, 2012

(65) Prior Publication Data

US 2014/0049311 A1 Feb. 20, 2014

(51) Int. Cl.
*H03K 17/687* (2006.01)

(52) U.S. Cl.
USPC ............ 327/434; 327/436; 327/437; 333/103

(58) Field of Classification Search
USPC ............................ 327/434, 436, 437; 333/103
See application file for complete search history.

(56) References Cited

U.S. PATENT DOCUMENTS

| | | |
|---|---|---|
| 3,551,788 A | 12/1970 | Summer |
| 3,699,359 A | 10/1972 | Shelby |
| 4,053,916 A | 10/1977 | Cricchi et al. |
| 4,316,101 A | 2/1982 | Minner |
| 4,491,750 A | 1/1985 | Janutka |
| 5,012,123 A | 4/1991 | Ayasli et al. |
| 5,146,178 A | 9/1992 | Nojima et al. |
| 5,313,083 A | 5/1994 | Schindler |
| 5,416,043 A | 5/1995 | Burgener et al. |
| 5,492,857 A | 2/1996 | Reedy et al. |
| 5,548,239 A | 8/1996 | Kohama |
| 5,553,295 A | 9/1996 | Pantelakis et al. |
| 5,572,040 A | 11/1996 | Reedy et al. |
| 5,596,205 A | 1/1997 | Reedy et al. |
| 5,600,169 A | 2/1997 | Burgener et al. |
| 5,663,570 A | 9/1997 | Reedy et al. |
| 5,777,530 A | 7/1998 | Nakatuka |
| 5,801,577 A | 9/1998 | Tailliet |

(Continued)

FOREIGN PATENT DOCUMENTS

| | | |
|---|---|---|
| CN | 1256521 | 6/2000 |
| EP | 0385641 | 9/1990 |

(Continued)

OTHER PUBLICATIONS

Assaderaghi, et al.; "Dynamic Threshold-Voltage MOSFET (DTMOS) for Ultra-Low Voltage VLSI;" IEEE. vol. 44; No. 3; 414-421; Mar. 1997.

(Continued)

*Primary Examiner* — Kenneth B. Wells
(74) *Attorney, Agent, or Firm* — Schwabe Williamson & Wyatt

(57) ABSTRACT

Embodiments provide a switching device including one or more field-effect transistors (FETs) and bias circuitry. The one or more FETs may transition between an off state and an on state to facilitate switching of a transmission signal. The one or more FETs may include a drain terminal, a source terminal, a gate terminal, and a body. The biasing circuitry may bias the drain terminal and the source terminal to a first DC voltage in the on state and a second DC voltage in the off state. The first and second DC voltages may be non-negative. The biasing circuitry may be further configured to bias the gate terminal to the first DC voltage in the off state and the second DC voltage in the on state.

20 Claims, 5 Drawing Sheets

(56) References Cited

U.S. PATENT DOCUMENTS

| | | | |
|---|---|---|---|
| 5,818,099 | A | 10/1998 | Burghartz |
| 5,861,336 | A | 1/1999 | Reedy et al. |
| 5,863,823 | A | 1/1999 | Burgener |
| 5,883,396 | A | 3/1999 | Reedy et al. |
| 5,895,957 | A | 4/1999 | Reedy et al. |
| 5,920,233 | A | 7/1999 | Denny |
| 5,930,638 | A | 7/1999 | Reedy et al. |
| 5,945,867 | A | 8/1999 | Uda et al. |
| 5,973,363 | A | 10/1999 | Staab et al. |
| 5,973,382 | A | 10/1999 | Burgener et al. |
| 6,057,555 | A | 5/2000 | Reedy et al. |
| 6,066,993 | A | 5/2000 | Yamamoto et al. |
| 6,160,292 | A | 12/2000 | Flaker et al. |
| 6,173,235 | B1 | 1/2001 | Maeda |
| 6,249,027 | B1 | 6/2001 | Burr |
| 6,308,047 | B1 | 10/2001 | Yamamoto et al. |
| 6,452,232 | B1 | 9/2002 | Adan |
| 6,504,212 | B1 | 1/2003 | Allen et al. |
| 6,563,366 | B1 | 5/2003 | Kohama |
| 6,631,505 | B2 | 10/2003 | Arai |
| 6,632,724 | B2 | 10/2003 | Henley et al. |
| RE38,319 | E | 11/2003 | Lin |
| 6,642,578 | B1* | 11/2003 | Arnold et al. ................ 257/341 |
| 6,693,326 | B2 | 2/2004 | Adan |
| 6,790,747 | B2 | 9/2004 | Henley et al. |
| 6,804,502 | B2 | 10/2004 | Burgener et al. |
| 6,898,778 | B2 | 5/2005 | Kawanaka |
| 6,908,832 | B2 | 6/2005 | Farrens et al. |
| 6,924,673 | B2 | 8/2005 | Tanishima |
| 6,958,519 | B2 | 10/2005 | Gonzalez |
| 6,969,668 | B1 | 11/2005 | Kang et al. |
| 6,978,437 | B1 | 12/2005 | Rittman et al. |
| 6,989,706 | B2 | 1/2006 | Sekigawa |
| 7,056,808 | B2 | 6/2006 | Henley et al. |
| 7,057,472 | B2 | 6/2006 | Fukamachi et al. |
| 7,058,922 | B2 | 6/2006 | Kawanaka |
| 7,123,898 | B2 | 10/2006 | Burgener et al. |
| 7,138,846 | B2* | 11/2006 | Suwa et al. .................. 327/308 |
| 7,158,067 | B2 | 1/2007 | Lauritzen |
| 7,404,157 | B2 | 7/2008 | Tanabe |
| 7,460,852 | B2 | 12/2008 | Burgener et al. |
| 7,616,482 | B2 | 11/2009 | Prall |
| 7,796,969 | B2 | 9/2010 | Kelly et al. |
| 7,860,499 | B2 | 12/2010 | Burgener et al. |
| 7,863,691 | B2 | 1/2011 | Wagner, Jr. et al. |
| 7,890,891 | B2 | 2/2011 | Stuber et al. |
| 7,910,993 | B2 | 3/2011 | Brindle et al. |
| 8,129,787 | B2 | 3/2012 | Brindle et al. |
| 8,159,283 | B2* | 4/2012 | Sugiyama ..................... 327/430 |
| 2001/0015461 | A1 | 8/2001 | Ebina |
| 2001/0045602 | A1 | 11/2001 | Maeda et al. |
| 2002/0195623 | A1 | 12/2002 | Horiuchi |
| 2003/0002452 | A1 | 1/2003 | Sahota |
| 2003/0205760 | A1 | 11/2003 | Kawanaka et al. |
| 2004/0080364 | A1 | 4/2004 | Sander et al. |
| 2005/0167751 | A1 | 8/2005 | Nakajima et al. |
| 2007/0023833 | A1 | 2/2007 | Okhonin et al. |
| 2008/0073719 | A1 | 3/2008 | Fazan et al. |
| 2008/0076371 | A1 | 3/2008 | Dribinsky et al. |
| 2008/0303080 | A1 | 12/2008 | Bhattacharyya |
| 2009/0029511 | A1 | 1/2009 | Wu |
| 2011/0227637 | A1 | 9/2011 | Stuber et al. |
| 2012/0169398 | A1 | 7/2012 | Brindle et al. |
| 2012/0267719 | A1 | 10/2012 | Brindle et al. |

FOREIGN PATENT DOCUMENTS

| | | |
|---|---|---|
| EP | 1006584 | 6/2000 |
| EP | 1451890 | 2/2011 |
| JP | 5575348 | 6/1980 |
| JP | 01254014 | 10/1989 |
| JP | 02161769 | 6/1990 |
| JP | 04183008 | 6/1992 |
| JP | 06334506 | 12/1994 |
| JP | 08148949 | 6/1996 |
| JP | 08307305 | 11/1996 |
| JP | 09284114 | 10/1997 |
| JP | 10242829 | 9/1998 |
| JP | 11136111 | 5/1999 |
| JP | 2003060451 | 2/2003 |
| JP | 3408762 | 5/2003 |
| JP | 2003189248 | 7/2003 |
| JP | 2004515937 | 5/2004 |
| WO | 9523460 | 8/1995 |
| WO | 0227920 | 4/2002 |
| WO | 2007008934 | 1/2007 |
| WO | 2007035610 | 3/2007 |

OTHER PUBLICATIONS

Bolam, R. et al., "Reliability Issues for Silicon-on-Insulator," Electron Devices Meeting Technical Digest, 2000, pp. 131-134.

Burgener, et al.; "CMOS SOS Switches Offer Useful Features, High Integration;" Microwaves & RF; 107-118; Aug. 2001.

Caverly, R. et al., "A Silicon CMOS Monolithic RF and Microwave Switching Element," 27th European Microwave Conference, Sep. 1997, pp. 1046-1051.

Caverly; "Linear and Nonlinear Characteristics of the Silicon CMOS Monolithic 50-Ω Microwave and RF Control Element;" IEEE. vol. 34; No. 1; 124-126; Jan. 1999.

Celler, et al.; "Smart Cut—A guide to the technology, the process, the products;" http://www.soitec.com/pdf/SmartCut_WP.pdf; Jul. 2003.

Chao, et al.; "High-Voltage and High-Temperature Applications of DTMOS with Reverse Schottky Barrier on Substrate Conctacts;" IEEE Electron Device Letters; vol. 25; No. 2; Feb. 2004; pp. 86-88.

Chung, I. et al., "SOI MOSFET Structure with a Junction-Type Body Contact for Suppression of Pass Gate Leakage," IEEE Transactions on Electron Devices, Jul. 2001, pp. 1360-1365, vol. 48, No. 7.

Dean; "Transistors, Theory and Circuitry." McGraw-Hill Publ. Co. Ltdl; 90-93; 1964.

Drake, et al.; "Dynamic-Threshold Logic for Low-Power VLSI Design." http://www.research.ibm.com/acas/projects/01drake.pdf; 2003.

Edwards, et al.; "The Effect of Body Contact Series Resistance on SOI CMOS Amplifier Stages;" IEEE Transactions on Electron Devices; vol. 44; No. 12; Dec. 1997; pp. 2290-2294.

Hameau, F. et al., "Radio-Frequency Circuits Integration Using CMOS SOI 0.25 μm Technology," 2002 RF IC Design Workshop Europe, Mar. 19-22, 2002, 6 pages.

Hess et al.; "Transformerless Capacitive Coupling of Gate Signals for Series Operation of Power MOS Devices;" IEEE; vol. 15; No. 5; Sep. 2000.

Hirano, Y. et al., "Impact of Actively Body-bias Controlled (ABC) SOI SRAM by using Direct Body Contact Technology for Low-Voltage Application," Electron Devices Meeting Technical Digest, 2003, pp. 2.4.1-2.4.4.

Hu, C. et al., "A Unified Gate Oxide Reliability Model," IEEE 37th Annual International Reliability Physics Symposium, 1999, pp. 47-51.

Huang et al.; "A 0.5-μm CMOS T/R Switch for 900-MHz Wireless Applications;" IEEE Journal of Solid-State Circuits; vol. 36; No. 3; Mar. 2001.

Iyama, et al.; "L-Band SPDT Switch Using Si-MOSFET;" The Institute of Electronics, Information and Communication Engineers (IEICE); 636-643; 1996.

Johnson, et al.; "Advanced Thin-Film Silicon-on-Sapphire Technology: Microwave Circuit Applications," IEEE; vol. 45; No. 5; May 1998.

Kuang, J. et al., "A floating-body charge monitoring technique for partially depleted SOI0 technology," Int. J. Electronics, Nov. 2004, pp. 625-637, vol. 91, No. 11.

Kuang, J. et al., "SRAM Bitline Circuits on PD SOI: Advantages and Concerns," IEEE Journal of Solid-State Circuits, Jun. 1997, pp. 837-844, vol. 32, No. 6.

Kuo, et al.; "Low-Voltage SOI CMOS VLSI Devices and Circuits;" Wiley Interscience, New York, XP001090589, pp. 57-60 and pp. 349-354; 2001.

(56) References Cited

OTHER PUBLICATIONS

Lauterbach, et al.; "Charge Sharing Concept and New Clocking Scheme for Power Efficiency and Electromagnetic Emission Improvement of Boosted Charge Pumps;" IEEE Journal of Solid-State Circuits; vol. 35; No. 5; pp. 719-723; May 2000.

Lee et al., "Effects of Gate Structures on the RF Performance in PD SOI MOSFETs," IEEE Microwave and Wireless Components Letters, Apr. 2005, pp. 223-225, vol. 15, No. 4.

Lee, et al.; "Effect of Body Structure on Analog Performance of SOI NMOSFETs;" Proceedings; 1998 IEEE International SOI Conference; Oct. 5-8, 1998; pp. 61-62.

Lee, H. et al., "Analysis of body bias effect with PD-SOI for analog and RF applications," Solid State Electronics, 2002, pp. 1169-1176, vol. 46.

Lee, H. et al., "Harmonic Distortion due to Narrow Width Effects in Deep sub-micron SOI-CMOS Device for analog-RF applications," 2002 IEEE International SOI Conference, Oct. 2002, pp. 83-85.

Li, et al.; "A 15-GHz Integrated CMOS Switch with 21.5-dBm IP1dB and 1.8-dB Insertion Loss;" IEEE; 2004 Symposium on VLSI Circuits; Digest of Technical Papers; Jun. 17-19, 2004.

Maeda, et al.; "Substrate-Bias Effect and Source-Drain Breakdown Characteristics in Body-Tied Short-Channel SOI MOSFET's;" IEEE Transactions on Electron Devices; vol. 46; No. 1; Jan. 1999; pp. 151-158.

Makioka, S. et al., "Super Self-Aligned GaAs RF Switch IC with 0.25 dB Extremely Low Insertion Loss for Mobile Communication Systems," IEEE Transactions on Electron Devices, Aug. 2001, pp. 1510-1514, vol. 48, No. 8.

Megahed, M. et al, "Low Cost UTSI Technology for RF Wireless Applications," IEEE MTT-S Digest, 1998, pp. 981-984.

Orndorff, et al.; "CMOS/SOS/LSI Switching Regulator Control Device;" Solid-State Circuits Conf.; Digest of Technical Papers; IEEE International; vol. XXI; pp. 234-235; Feb. 1978.

Phillips Semiconductors; "Single Pole Double Throw (SPDT) Switch, RF Communication Products;" IC17 Handbook; 1997.

Rodgers, P. et al., "Silicon UTSi CMOS RFIC for CDMA Wireless Communications Systems," IEEE MTT-S Digest, 1999, pp. 485-488.

Rozeau, O. et al., "SOI Technologies Overview for Low-Power Low-Voltage Radio-Frequency Applications," Analog Integrated Circuits and Signal Processing, 2000, pp. 93-114, vol. 25.

Sedra, A. et al., Microelectronic Circuits, 1998, Fourth Edition, University of Toronto Press, Oxford University Press, pp. 374-375.

Sleight, J. et al., "Transient Measurements of SOI Body Contact Effectiveness," IEEE Electron Device Letters, Dec. 1998, pp. 499-501, vol. 19, No. 12.

Suehle et al., "Low Electric Field Breakdown of Thin SiO2 Films Under Static and Dynamic Stress," IEEE Transactions on Electron Devices, May 1997, pp. 801-808, vol. 44, No. 5.

Tinella, et al.; "A High-Performance CMOS-SOI Antenna Switch for the 2.5 5-GHz Band;" IEEE Journal of Solid-State Circuits; vol. 38; No. 7; Jul. 2003.

Wei, et al.; "Measurement of Transient Effects in SOI DRAM/SRAM Access Transistors;" IEEE Electron Device Letters; vol. 17; No. 5; May 1996.

Workman, et al.; "A Comparative Analysis of the Dynamic Behavior of BTG/SOI MOSFET's and Circuits with Distributed Body Resistance;" IEEE Transactions on Electron Devices; vol. 45; No. 10; Oct. 1998; pp. 2138-2145.

Yamamoto, et al.; A 2.2-V Operation, 2.4-GHz Single-Chip GaAs MMIC Transceiver for Wireless Applications; IEEE; vol. 34; No. 4; Apr. 1999.

Non-Final Office Action in U.S. Appl. No. 13/742,086, dated Sep. 20, 2013.

Final Office Action in U.S. Appl. No. 13/742,086, dated Mar. 4, 2014.

\* cited by examiner

200

Bias, to place a FET in an on state, a drain terminal and a source terminal of the FET with a first non-negative DC voltage and a gate terminal of the FET with a second non-negative DC voltage

204

Bias, to place the FET in an off state, the drain terminal and the source terminal with the second non-negative DC voltage and the gate terminal with the first non-negative DC voltage

SWITCHING DEVICE WITH NON-NEGATIVE BIASING

FIELD

Embodiments of the present disclosure relate generally to the field of circuits, and more particularly to switching devices with non-negative biasing.

BACKGROUND

Radio frequency (RF) switching devices are used in many applications, such as in wireless communication systems, to selectively pass an RF signal. For switching devices that include field-effect transistors (FETs), a negative bias voltage is required to bias the FETs in an off state. The negative bias voltage is typically generated by a negative voltage generator that includes an oscillator and a charge pump. The oscillator may inject spurs into the RF core of the switching device, thereby causing spurious emissions.

BRIEF DESCRIPTION OF THE DRAWINGS

Embodiments are illustrated by way of example and not by way of limitation in the figures of the accompanying drawings, in which like references indicate similar elements and in which:

FIG. 2 illustrates a flow chart of a method for biasing a switching device in accordance with various embodiments.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein.

"Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
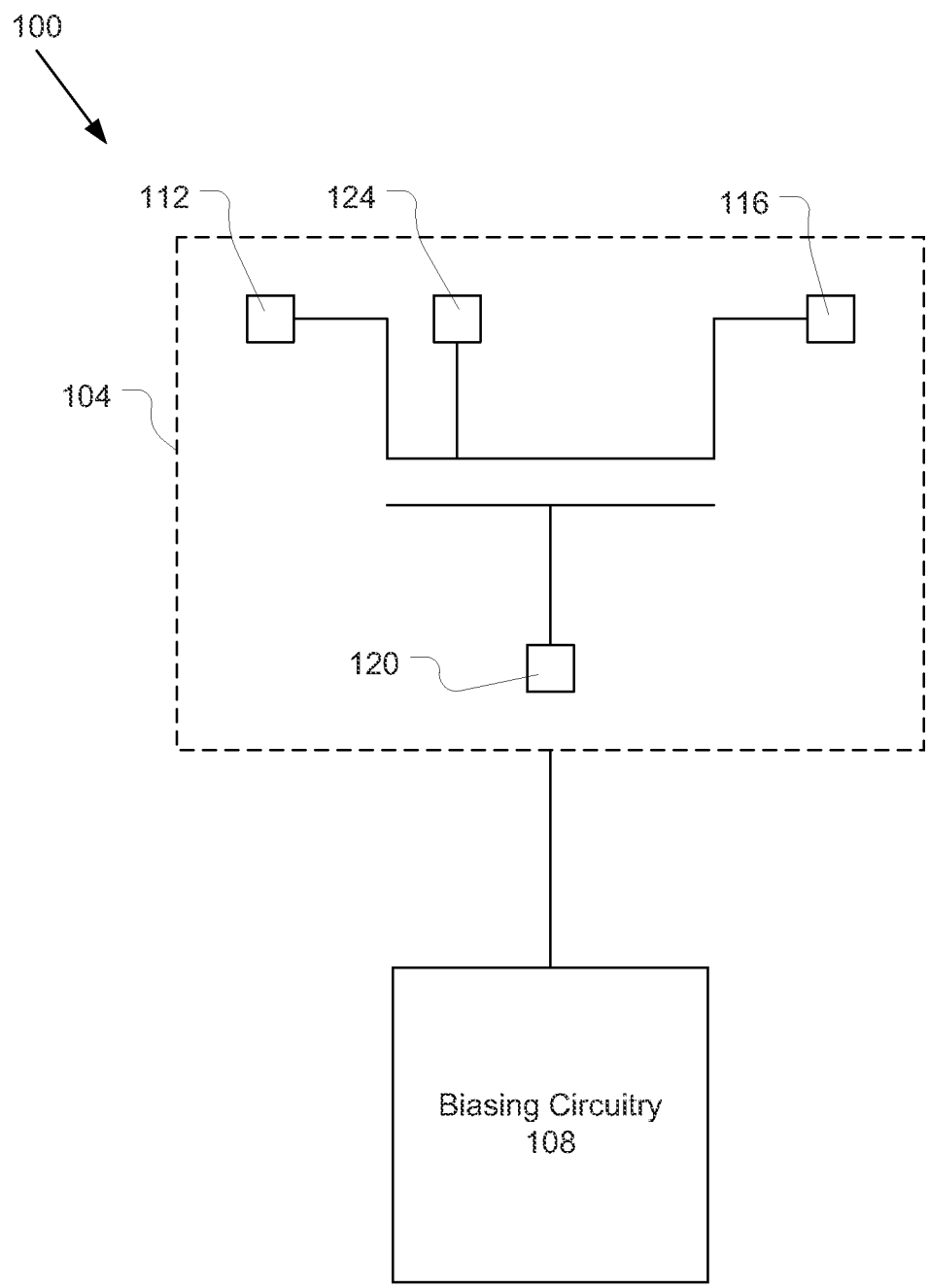
FIG. 1 illustrates a circuit diagram of a switching device in accordance with various embodiments.

FIG. 1 illustrates a switching circuit 100 in accordance with various embodiments. Switching circuit 100 (also referred to as circuit 100) may include a field-effect transistor (FET) 104 coupled with biasing circuitry 108. The FET 104 may include a drain terminal 112, a source terminal 116, a gate terminal 120, and a body 124. In some embodiments, the FET 104 may be an enhancement mode FET. Additionally, or alternatively, the FET 104 may be a silicon on insulator (SOI) device and/or a bulk complementary metal-oxide-semiconductor (CMOS) device.

In various embodiments, the FET 104 may selectively transition between an off state and an on state to facilitate switching of a transmission signal (e.g., a radio frequency (RF) signal). For example, the FET 104 may receive the transmission signal at the drain terminal 112 and pass the transmission signal to the source terminal 116 if the FET 104 is in the on state. The FET 104 may prevent the passage of the transmission signal between the drain terminal 112 and the source terminal 116 if the FET 104 is in the off state. The FET 104 may receive a control signal at the gate terminal 120 to transition the FET 104 between the off state and the on state.

In some embodiments, the FET 104 may be coupled in series with an interconnect to selectively pass the transmission signal to an output terminal (e.g., for transmission by an antenna and/or other structure). In other embodiments, the FET 104 may be coupled in shunt with the interconnect to selectively pass the transmission signal to a ground terminal (e.g., to divert the transmission signal and prevent it from being passed to the output terminal). As discussed below and shown in FIG. 3, some embodiments may include a switching module that includes a series transistor coupled in series with the interconnect and a shunt transistor coupled in shunt to the ground. In a first state of the switching module, the series transistor may be on and the shunt transistor may be off to pass the transmission signal to the output terminal. In a second state of the switching module, the series transistor may be off and the shunt transistor may be on to pass the transmission signal to the ground terminal and prevent the transmission signal from passing to the output terminal.

Various embodiments provide a biasing scheme to be used by the biasing circuitry 108 for the FET 104. The biasing scheme is discussed herein with reference to an n-type enhancement mode FET, however, in other embodiments, the biasing scheme may be used and/or modified for use with another type of FET, such as a p-type FET.

In various embodiments, the biasing circuitry 108 may produce direct current (DC) bias voltages to bias the drain terminal 112, the source terminal 116, the gate terminal 120, and/or the body 124 of the FET 104. The biasing circuitry 108 may bias the drain terminal 112 and the source terminal 116 to a first DC voltage in the on state and a second DC voltage in the off state. The second DC voltage may be different from the first DC voltage. In some embodiments, the biasing circuitry 108 may bias the gate terminal 120 to the second DC voltage in the on state and the first DC voltage in the off state. In some embodiments, the body 124 may be biased to the first voltage in the on state and the off state.

In various embodiments, the first and second DC voltages may be non-negative. For example, the first DC voltage may be a zero voltage (e.g. ground voltage), and the second DC voltage may be a positive voltage. In one non-limiting example, the second DC voltage may be about 1V to about 5V, such as about 2.5 Volts.

Accordingly, the biasing scheme described herein may use only non-negative bias voltages, thereby eliminating the need for an oscillator or a charge pump to generate a negative voltage. Thus, the potential for spurious emissions due to spurs from the oscillator is eliminated. Additionally, only two bias voltages may need to be generated to control the FET 104 during the on and off states. Furthermore, as discussed further below, only two control lines may be required to control a pair of transistors in a series-shunt configuration (e.g., a series transistor and a shunt transistor). Accordingly, the circuit 100 may occupy a smaller size (e.g., on a die) compared with a circuit that includes an oscillator, charge pump, and/or additional control lines.

Additionally, the biasing scheme may maintain a maximum voltage difference among the nodes of FET 104 (e.g., drain terminal 112, source terminal 116, gate terminal 120, and body 124), during the on and off states, equal to the difference between the first DC voltage and the second DC voltage.

FIG. 2 shows a flow chart of a method 200 of biasing a FET (e.g., FET 104) in accordance with various embodiments. In some embodiments, the method 200 may be performed by biasing circuitry, such as biasing circuitry 108.

At 204, the biasing circuitry may bias a drain terminal and a source terminal of the FET with a first non-negative DC voltage and a gate terminal of the FET with a second non-negative DC voltage. In some embodiments, the first non-negative DC voltage may be a ground voltage (e.g., zero Volts) and the second non-negative DC voltage may be a positive DC voltage (e.g., 2.5 Volts). The FET, given the biasing at 204, may be in an on state to selectively pass an RF signal at the drain terminal to the source terminal.

At 208, the biasing circuitry may bias the drain terminal and the source terminal with the second non-negative DC voltage and may bias the gate terminal with the first non-negative DC voltage. This may transition the FET to an off state in which the FET prevents the RF signal from passing from the drain terminal to the source terminal.

In some embodiments, a body of the FET may be biased to the first voltage in the on state and the off state.

Figure 3:
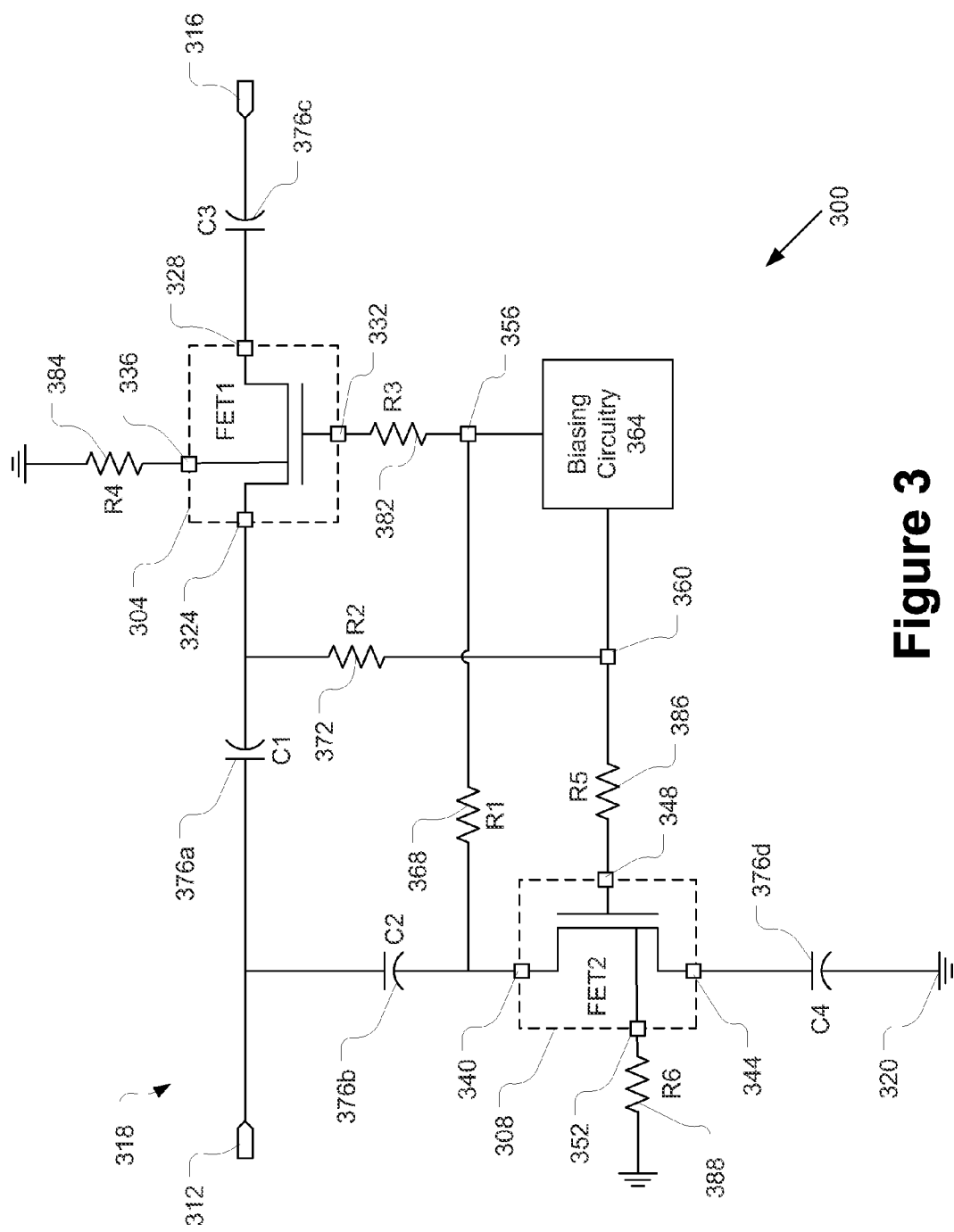
FIG. 3 illustrates a circuit diagram of a single-pole, single-throw switch in accordance with various embodiments.

FIG. 3 illustrates a switching circuit 300 (also referred to as a switching module or circuit 300) including a first FET (FET1) 304 (also referred to as series FET 304) and a second (FET2) FET 308 (also referred to as shunt FET 308) in accordance with various embodiments. The circuit 300 may be switchable between a first state and a second state. The circuit 300 may include an input terminal 312 that receives an RF signal (e.g., from a transmitter). The circuit 300 may pass the RF signal to an output terminal 316 if the circuit 300 is in the first state and may pass the RF signal to a ground terminal 320 if the circuit 300 is in the second state. In some embodiments, the output terminal 316 may be coupled with an antenna (not shown) for transmitting the RF signal.

The first FET 304 may be coupled in series between the input terminal 312 and the output terminal 316. The first FET 304 may also be described as being connected in series with an interconnect 318 running from the input terminal 312 to the output terminal 316. The first FET 304 may selectively pass the RF signal to the output terminal if the circuit 300 is in the first state. The first FET 304 may have a drain terminal 324, a source terminal 328, a gate terminal 332, and a body 336.

The second FET 308 may be coupled between the input terminal 312 and the ground terminal 320. The second FET 308 may also be described as being in shunt with the input terminal 312. The second FET 308 may selectively pass the RF signal to the ground terminal 320 if the circuit 300 is in the second state (thereby preventing the RF signal from passing to the output terminal 316). The second FET 308 may include a drain terminal 340, a source terminal 344, a gate terminal 348, and a body 352.

The circuit 300 may further include a first control terminal 356 and a second control terminal 360. The first control terminal 356 may receive a first control signal to bias the gate terminal 332 of the first FET 304, the drain terminal 340 and source terminal 344 of the second FET 308. The second control terminal 360 may receive a second control signal to bias the gate terminal 348 of the second FET 308, and the drain terminal 324 and source terminal 328 of the first FET 304. The circuit 300 may include bias circuitry 364 that provides the first control signal and the second control signal.

The first and second control terminals 356 and 360 may be coupled with the first FET 304 and/or second FET 308 in any suitable arrangement to bias the first FET 304 and/or second FET 308. For example, as shown in FIG. 3, the first control terminal 356 may be coupled with the gate terminal 332 of the first FET 304 (e.g., via a resistor R3 382) and coupled with the drain terminal 340 of the second FET 308 (e.g., via a resistor R1 368). The second control terminal 360 may be coupled with the gate terminal 348 of the second FET 308 (e.g., via a resistor R5 386) and the drain terminal 324 of the first FET 304 (e.g., via a resistor R2 372). The first FET 304 and second FET 308 may include a bias resistor (not shown) coupled between the respective drain terminals and source terminals to bias the source terminals at the same voltage as the respective drain terminals.

The circuit 300 may further include DC blocking capacitors 376a-d to facilitate the different bias voltages at the drain terminal 324 and source terminal 328 of the first FET 304 compared with the drain terminal 340 and source terminal 344 of the second FET 308 at a given time (e.g., in the first state or the second state). A first DC blocking capacitor C1 376a may be coupled between the input terminal 312 and the drain terminal 324 of first FET 304, and a second DC blocking capacitor C2 376b may be coupled between the input terminal 312 and the drain terminal 340 of the second FET 308. Capacitors C1 376a and C2 376b may isolate the DC voltage at the drain terminal 324 from the DC voltage at the drain terminal 340 to facilitate different bias voltages. A third DC blocking capacitor C3 376c may be coupled between the source terminal 328 of the first FET 304 and the output terminal 316 to isolate the DC voltage at the source terminal from the DC voltage at the output terminal 316. A fourth DC blocking capacitor C4 376d may be coupled between the source terminal 344 of the second FET 308 and the ground terminal 320 to isolate the DC voltage at the source terminal 344 from the DC voltage at the ground terminal 320.

In various embodiments, the first control signal may provide a first DC voltage during the second state of the circuit 300 and a second DC voltage during the first state of the circuit 300. The second control signal may provide the first DC voltage during the first state and the second DC voltage during the second state. The second DC voltage may be different from the first DC voltage, and the first and second DC voltages may both be non-negative. For example, the first DC voltage may be a ground voltage (e.g., zero Volts) and the second DC voltage may be a positive DC voltage (e.g., 2.5 Volts).

In various embodiments, the body 336 of the first FET 304 and the body 352 of the second FET 308 may be biased to the ground voltage (e.g., zero Volts) via resistors R4 384 and R6 388, respectively, during the first state and the second state of the circuit 300.

In various embodiments, in the first state of circuit 300, the first FET 304 may be on and the second FET 308 may be off. Accordingly, the first FET 304 may pass the RF signal from the input terminal 312 to the output terminal 316. In the second state of circuit 300, the first FET 304 may be off and the second FET 308 may be on. Accordingly, the first FET 304 may prevent the RF signal from passing to the output terminal 316, and the second FET 308 may pass the RF signal to the ground terminal 320.

Accordingly, the circuit 300 may require only two control lines (e.g., control terminals 356 and 360) to control both the series FET 304 and the shunt FET 308. Additionally, the circuit 300 may not require generation of a negative bias voltage. The additional DC blocking capacitors 376a-d may provide some insertion loss and/or reduced isolation, but the impact may be relatively minor (e.g., insertion loss of less than 0.04 dB). Thus, the circuit 300 may have a smaller size (e.g., die area) compared with prior switching circuits without substantial performance degradation.

It will be apparent that in some embodiments the first FET 304 may be included in a stack of a plurality of FETs coupled between the input terminal 312 and the output terminal 316 (e.g., a plurality of series FETs). Additionally, or alternatively, the second FET 308 may be included in a stack of a plurality of FETs coupled between the input terminal 312 and the ground terminal 320 (e.g., a plurality of shunt FETs).

Figure 4:
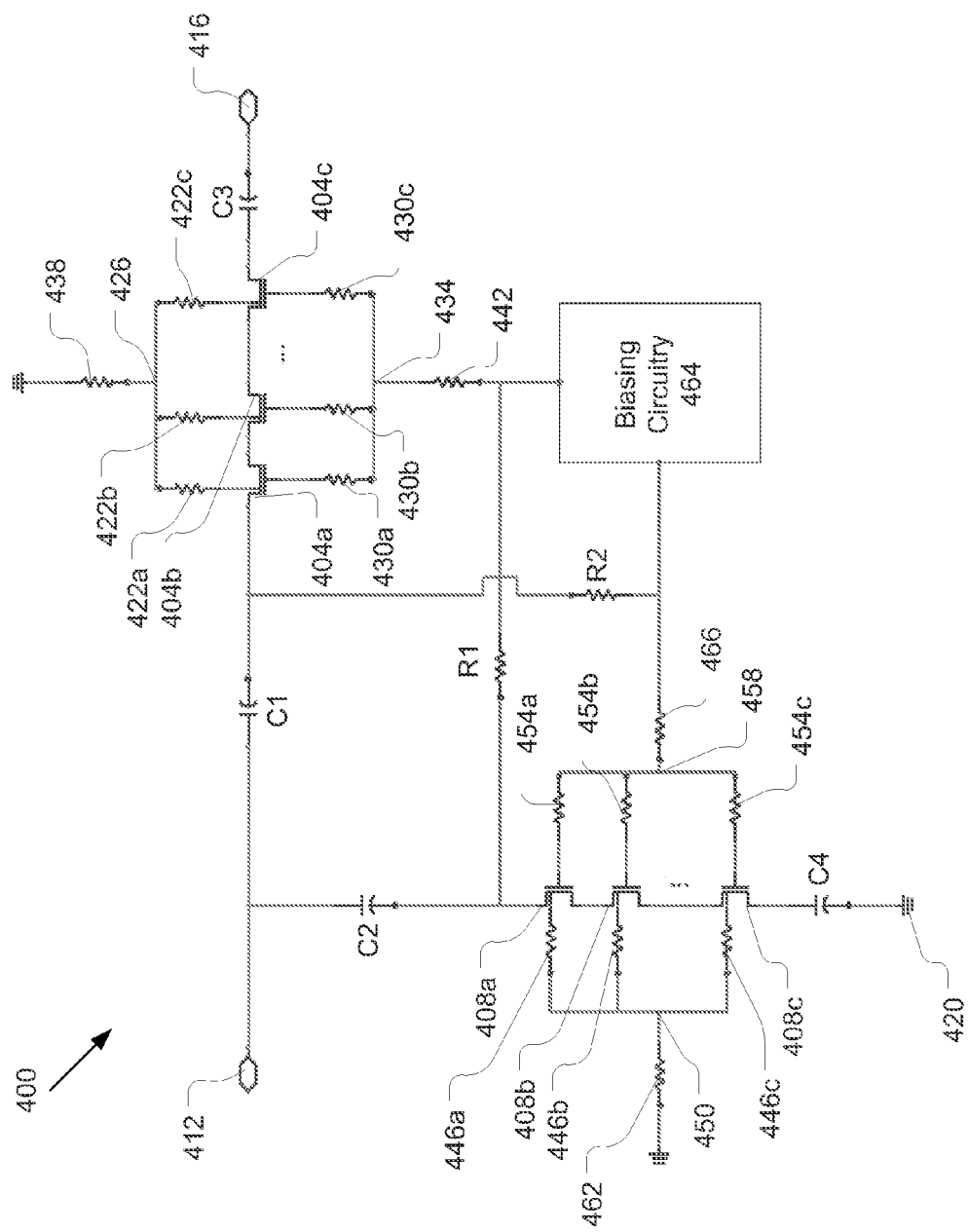
FIG. 4 illustrates a circuit diagram of a single-pole, single-throw switch with a plurality of series field-effect transistors (FETs) and a plurality of shunt FETs in accordance with various embodiments.

For example, FIG. 4 illustrates a switching circuit 400 (also referred to as circuit 400) that is similar to circuit 300 except that circuit 400 includes a first stack of FETs 404 (e.g., including a plurality of FETs 404a-c) coupled in series between the an input terminal 412 and an output terminal 416, and a second stack of FETs 408 (e.g., a including a plurality of FETs 408a-c) coupled in shunt between the input terminal 412 and a ground terminal 420. The first stack of FETs 404 and/or second stack of FETs 408 may include any suitable number of FETs.

The circuit 400 further include a body resistor 422a-c coupled between a body terminal of the respective FET 404a-c and a common body node 426. Additionally, a gate resistor 430a-c may be coupled between a gate terminal of the respective FET 404a-c and a common gate node 434. In some embodiments, the circuit 400 may include a common resistor 438 coupled between the common body node 426 and ground, and a common resistor 442 coupled between the common gate node 434 and biasing circuitry 464. Other embodiments may not include the common resistor 438 and/or common resistor 442.

The circuit 400 may further include a body resistor 446a-c coupled between a body terminal of the respective FET 408a-c and a common body node 450. Additionally, a gate resistor 454a-c may be coupled between a gate terminal of the respective FET 408a-c and a common gate node 458. In some embodiments, the circuit 400 may include a common resistor 462 coupled between the common body node 450 and ground, and a common resistor 466 coupled between the common gate node 458 and biasing circuitry 464. Other embodiments may not include the common resistor 462 and/or common resistor 466.

Figure 5:
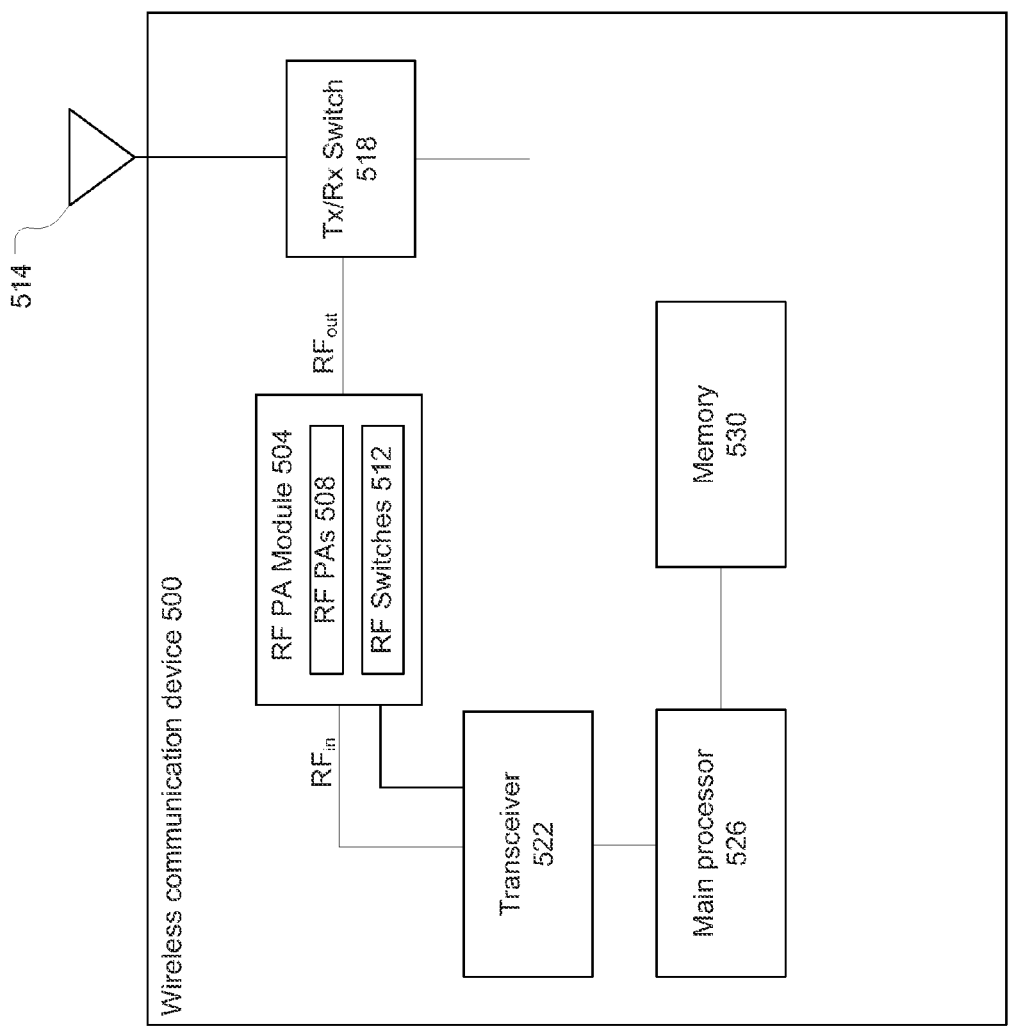
FIG. 5 is a block diagram of an exemplary wireless communication device in accordance with various embodiments.

A block diagram of an exemplary wireless communication device 500 is illustrated in FIG. 5 in accordance with some embodiments. Wireless communication device 500 may have an RF power amplifier (PA) module 504 including one or more RF PAs 508. RF PA module 504 may further include one or more RF switches 512 coupled with one or more of the RF PAs 508. The RF switches 512 may be similar to and/or include switching circuits 100, 300, and/or 400. Additionally, or alternatively, the RF switches 512 may be configured to carry out method 200.

In addition to the RF PA module 504, the wireless communication device 500 may have an antenna structure 514, a Tx/Rx switch 518, a transceiver 522, a main processor 526, and a memory 530 coupled with each other at least as shown. While the wireless communication device 500 is shown with transmitting and receiving capabilities, other embodiments may include devices with only transmitting or only receiving capabilities. While RF switches 512 are shown as included in RF PA module 504, in other embodiments, RF switches 512 may be included in other components of the wireless communication device 500, such as Tx/Rx switch 518 and/or transceiver 522, in addition to or instead of RF PA module 504.

In various embodiments, the wireless communication device 500 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 526 may execute a basic operating system program, stored in the memory 530, in order to control the overall operation of the wireless communication device 500. For example, the main processor 526 may control the reception of signals and the transmission of signals by transceiver 522. The main processor 526 may be capable of executing other processes and programs resident in the memory 530 and may move data into or out of memory 530, as desired by an executing process.

The transceiver 522 may receive outgoing data (e.g., voice data, web data, e-mail, signaling data, etc.) from the main processor 526, may generate the $RF_{in}$ signal(s) to represent the outgoing data, and provide the $RF_{in}$ signal(s) to the RF PA module 504. The transceiver 522 may also control the RF PA module 504 to operate in selected bands and in either full-power or backoff-power modes. In some embodiments, the transceiver 522 may generate the $RF_{in}$ signal(s) using OFDM modulation.

The RF PA module 504 may amplify the $RF_{in}$ signal(s) to provide $RF_{out}$ signal(s) as described herein. The $RF_{out}$ signal(s) may be forwarded to the Tx/Rx switch 518 and then to the antenna structure 514 for an over-the-air (OTA) transmission. In some embodiments, Tx/Rx switch 518 may include a duplexer. In a similar manner, the transceiver 522 may receive an incoming OTA signal from the antenna structure 514 through the Tx/Rx switch 518. The transceiver 522 may process and send the incoming signal to the main processor 526 for further processing.

The one or more RF switches 512 may be used to selectively pass RF signal(s) (e.g., $RF_{in}$ signal(s) and/or $RF_{out}$ signal(s)) to, from, and/or within components of wireless communication device 500.

In various embodiments, the antenna structure 514 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 500 is given by way of example and that, for simplicity and clarity, only so much of the construction and operation of the wireless communication device 500 as is necessary for an understanding of the embodiments is shown and described. Various embodiments contemplate any suitable component or combination of components performing any suitable tasks in association with wireless communication device 500, according to particular needs. Moreover, it is understood that the wireless communication device 500 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
   a field-effect transistor (FET) configured to transition between an off state and an on state to facilitate switching of a transmission signal, the FET having a gate terminal, a drain terminal, and a source terminal; and
   biasing circuitry coupled with the FET and configured to:
     bias the drain terminal and the source terminal to a first direct current (DC) voltage in the on state and a second DC voltage in the off state, the second DC voltage being different from the first DC voltage; and
     bias the gate terminal to the first DC voltage in the off state and the second DC voltage in the on state.

2. The apparatus of claim 1, wherein the gate terminal of the FET is to receive a control signal to switch the FET between the off state and the on state.

3. The apparatus of claim 2, wherein the FET further includes a body, and wherein the biasing circuitry is configured to bias the body to the first voltage in the on state and the off state.

4. The apparatus of claim 2, wherein the first and second DC voltages are non-negative.

5. The apparatus of claim 4, wherein the first DC voltage is a zero voltage and the second DC voltage is a positive voltage.

6. The apparatus of claim 2, wherein the FET is an enhancement mode FET.

7. The apparatus of claim 6, wherein the FET is a silicon on insulator or bulk complementary metal-oxide-semiconductor device.

8. A switching apparatus comprising:
   an input terminal configured to receive a radio frequency (RF) signal, the switching apparatus configured to pass the RF signal to an output terminal if the switching apparatus is in a first state and to pass the RF signal to a ground terminal if the switching apparatus is in a second state;
   a first field-effect transistor (FET) coupled in series between the input terminal and the output terminal to selectively pass the RF signal to the output terminal if the switching apparatus is in the first state, the first FET having a first gate terminal and a first drain terminal;
   a second FET coupled between the input terminal and the ground terminal and having a second gate terminal and a second drain terminal;
   a first control terminal configured to receive a first control signal to bias the first gate terminal and the second drain terminal; and
   a second control terminal configured to receive a second control signal to bias the second gate terminal and the first drain terminal.

9. The switching apparatus of claim 8, wherein the first control signal provides a first direct current (DC) voltage during the second state and a second DC voltage during the first state, the second DC voltage being different from the first DC voltage, and the first and second DC voltages being non-negative.

10. The switching apparatus of claim 9, wherein the second control signal provides the second DC voltage during the second state and the first DC voltage during the first state.

11. The switching apparatus of claim 10, wherein the first DC voltage is a ground voltage and the second DC voltage is a positive DC voltage.

12. The switching apparatus of claim 8, wherein the first FET further includes a first body and the second FET further includes a second body, wherein the first and second bodies are configured to be biased to a ground voltage during the first state and the second state.

13. The switching apparatus of claim 8, further comprising:
   a first DC-blocking capacitor coupled between the input terminal and the first drain terminal; and
   a second DC-blocking capacitor coupled between the input terminal and the second drain terminal.

14. The switching apparatus of claim 13, wherein the first FET further includes a first source terminal and the second FET further includes a second source terminal, and wherein the switching apparatus further comprises:
   a third DC-blocking capacitor coupled between the first source terminal and the first output terminal; and
   a fourth DC-blocking capacitor coupled between the second source terminal and the ground terminal.

15. The switching apparatus of claim 14, wherein the input terminal is configured to receive the RF signal from a transmitter and to pass the RF signal to an antenna for transmission over a wireless communication network if the switching apparatus is in the first state.

16. The switching apparatus of claim 8, further comprising:
   a plurality of series FETs, including the first FET, coupled in series between the input terminal and the output terminal; and
   a plurality of shunt FETs, including the second FET, coupled in shunt between the input terminal and the ground terminal.

17. A system comprising:
   a transmitter configured to produce a radio frequency (RF) signal;
   an antenna configured to send the RF signal over a wireless communication network; and
   a field-effect transistor (FET) coupled between the transmitter and the antenna, the FET configured to pass the RF signal to the antenna if the FET is in an on state and to prevent passage of the RF signal to the antenna if the FET is in an off state, the FET including:
     a drain terminal configured to receive the RF signal;

a source terminal configured to pass the RF signal to the antenna if the FET is in the on state; and a gate terminal; and biasing circuitry coupled with the FET and configured to bias the gate terminal to a zero direct current (DC) voltage if the FET is in the off state and a positive DC voltage if the FET is in the on state, wherein the biasing circuitry is further configured to bias the drain terminal and source terminal to the positive DC voltage in the off state and the zero DC voltage in the on state.

18. The system of claim 17, wherein the FET further includes a body terminal, and wherein the biasing circuitry is further configured to bias the body terminal to a zero voltage in the on state and the off state.

19. The system of claim 17, wherein the FET is a first FET, the drain terminal is a first drain terminal, the source terminal is a first source terminal, and the gate terminal is a first gate terminal, and the system further comprising a second FET coupled between the transmitter and a ground terminal, the second FET having an off state and an on state and configured to pass the RF signal from the transmitter to the ground terminal if the second FET is in the on state, the second FET including:

a second drain terminal configured to receive the RF signal;

a second source terminal; and a second gate terminal;

wherein the biasing circuitry is further configured to:

bias the second source terminal and the second drain terminal to the positive DC voltage if the second FET is in the off state and the zero DC voltage if the second FET is in the on state; and bias the second gate terminal to the zero DC voltage if the second FET is in the off state and the positive DC voltage if the second FET is in the on state.

20. The system of claim 19, wherein the biasing circuitry includes:

a first control terminal configured to bias the first gate terminal, the second drain terminal, and the second source terminal;

a second control terminal configured to bias the second gate terminal, the first drain terminal, and the first source terminal.

* * * * *